Oct. 10, 1961 L. A. FREEDMAN 3,004,157

AUTOMATIC GAIN CONTROL SYSTEM FOR SEMI-CONDUCTOR DEVICES

Filed Nov. 24, 1953 2 Sheets-Sheet 1

INVENTOR.
Larry A. Freedman

BY H. C. Newton

ATTORNEY

AUTOMATIC GAIN CONTROL SYSTEM FOR SEMI-CONDUCTOR DEVICES

Filed Nov. 24, 1953 2 Sheets-Sheet 2

INVENTOR.
Larry A. Freedman
BY H. L. Newton
ATTORNEY 3,004,157
AUTOMATIC GAIN CONTROL SYSTEM FOR SEMI-CONDUCTOR DEVICES Larry A. Freedman, New Brunswick, N.J., assignor to Radio Corporation of America, a corporation of Delaware Filed Nov. 24, 1953, Ser. No. 394,004
17 Claims. (Cl. 250—20)

This invention relates to automatic gain control systems for radio signal receivers and the like, and in particular to such gain control systems for radio signal receivers of the type employing semi-conductor devices in the signal translating or amplifying portions thereof.

Signal receivers employing vacuum tubes are generally provided with an automatic gain control (AGC) system for maintaining the amplitude of the intermediate frequency signal applied to the second detector substantially constant over a relatively wide range of variation in the amplitude of the received signal. This is generally accomplished by using a portion of the rectified received radio signal to produce a negative direct current voltage which is proportional to the average value of the signal and applying it to the tube grids of the radio frequency, intermediate frequency and converter portions of the receiver to control the gain thereof inversely with respect to the signal strength, an increase in the signal strength increasing the negative bias on the tube grids and reducing the gain of the receiver. As is known, by providing an AGC system for a receiver, it may be tuned from strong to relatively weak signals without the necessity of resetting the manual gain or volume control.

Semi-conductor devices, such as transistors, which employ a semi-conductor element and at least three contacting electrodes have been developed for use in signal receivers as well as other types of signal conveying equipment. Transistors, as is well known, may be used as signal amplifiers and have, among others, the advantages of small size, durability, low power requirements and a long useful life. While these benefits of transistors recommend their use in many types of equipment in which vacuum tubes have heretofore been almost exclusively employed, the characteristics of transistors, which differ from those of vacuum tubes, have made it necessary either to adapt the external circuits of the equipment or construct completely new circuits to accommodate the peculiar characteristics of transistors.

In developing radio receivers employing transistors, the advantages of incorporating an AGC system in the receiver were suggested from past experiences with electron tube receivers.

Unfortunately, however, known AGC systems for transistorized receivers are found to have certain disadvantages. Thus, in common with other transistor circuits, temperature variations are found to have an adverse effect upon the stability of such systems. Furthermore, transistor AGC systems may introduce signal distortion. In addition, the gain of the AGC source should be maintained at a relatively high level to maintain the amplitude of the output signal at a sufficiently constant level. Thus, the ideal AGC system employing transistors would be characterized by temperature stability, low signal distortion, effective AGC action and high gain.

Accordingly, it is a principal object of the present invention to provide an improved AGC system for radio signal receivers and the like, employing semi-conductor devices in the signal translating and amplifying portions thereof, wherein the output signal is subjected to a minimum of distortion.

It is another object of the present invention to provide an improved AGC system for radio signal receivers and the like employing semi-conductor devices as the signal translating and amplifying means, whereby substantially distortion-free output signals of relatively high amplitude may be derived.

It is a further object of the present invention to provide a relatively simple AGC system of an improved construction for radio signal receivers whereby stable and efficient operation is achieved with relatively low construction cost.

An AGC system for radio signal receivers may be thought of, in general, to comprise two parts or units—the supply circuit or means from which AGC current or voltage is derived, and the signal amplifier means to which this AGC source is coupled to obtain the desired AGC action. Each of these parts or units may contribute equally to the performance qualities of the complete system. Accordingly, the above and other objects and advantages of the present invention are achieved, in general, by coupling the AGC supply means or source to the emitter electrodes of the controlled transistor amplifier means which may be the amplifiers of a radio receiver, thus providing effective AGC action as well as stability. The source of AGC current or voltage is the transistor second detector of the receiver, the base-emitter circuit of which is connected in such a way to provide audio frequency signal degeneration without direct-current degeneration, achieving thereby reduced distortion and an effective AGC current or voltage source for control purposes.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which:

Figures 1, 2, 3, 4:
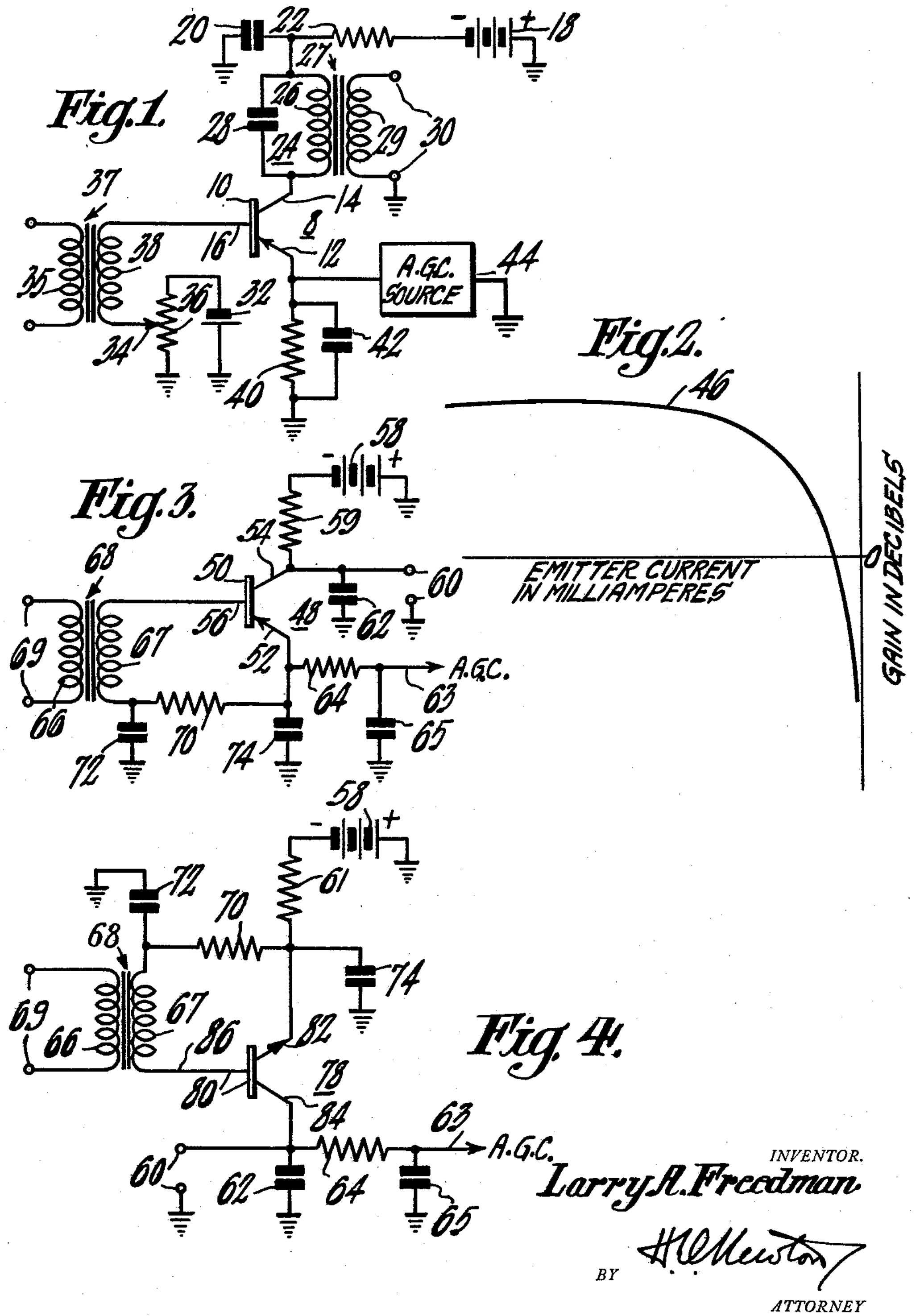
FIGURE 1 is a schematic circuit diagram of a transistor signal amplifier and AGC system for a radio signal receiver illustrating one embodiment of the present invention.
FIGURE 2 is a graph showing curves relating emitter current to gain for the transistor amplifier of FIGURE 1.
FIGURES 3 and 4 are schematic circuit diagrams of P-N-P and N-P-N junction transistor signal detector and AGC systems respectively, embodying the present invention.

Referring now to the drawing wherein like elements are designated by like reference numerals throughout the several figures and referring particularly to FIGURE 1, a transistor 8 comprises a semi-conductive body 10 having three contacting electrodes which are designated as an emitter 12, a collector 14 and a base 16. The transistor 8 is illustrated as being, by way of example only, of the P-N-P junction type, although it should be understood that throughout the description, the use of P-N-P junction transistors is merely for the purpose of illustration and any other suitable type having characteristics necessary for proper operation of the circuits may be used.

To properly bias the transistor 8 for amplifying action, a battery 18 is provided which has its positive terminal grounded and its negative terminal connected through a decoupling resistor 22 to the low signal voltage end of a parallel resonant tuned circuit 24 comprising a primary winding 26 of an interstage coupling transformer 27 and a capacitor 28. A by-pass capacitor 20 for radio frequency signals may be connected from the junction of resistor 22 and tuned circuit 24 to ground. Transformer 27 also includes a secondary winding 29 having a pair of output terminals 30. The tuned transformer as described thus provides frequency selectivity as well as proper impedance matching between the transistor amplifier 8 and a succeeding stage. The high signal voltage end of parallel resonant circuit 24 is connected with the collector 14 of transistor amplifier 8.

Further biasing means for the transistor 8 includes a battery 32 having a voltage rating somewhat smaller than that of battery 18, the positive terminal of which is grounded and the negative terminal of which is connected through a tap 34 of a voltage dividing potentiometer 36 and the secondary winding 38 of an input transformer 37 to the base 16 of transistor 8. The emitter 12 is connected to a source of fixed reference potential or ground for the system through an emitter resistor 40 which provides constant current emitter bias for the transistor 8 and which is by-passed by a capacitor 42.

By biasing the electrodes of the transistor 8 in the foregoing manner, the emitter 12 will be positive with respect to the base 16, while the collector 14 will be negative with respect to the base 16. Thus the emitter 12 is referred to as being biased in a forward or relatively conducting direction and the collector 14 in a reverse or relatively non-conducting direction, each with respect to the base 16. This is normal bias for transistor amplification action.

Heretofore, it has generally been the practice to obtain AGC action in transistor signal receivers by attempting to vary the base voltage of the stage or stages which are to be controlled. In accordance with one feature of the present invention, improved AGC action is obtained by varying the emitter current of the transistor stage or stages of the receiver which are to be controlled. Thus, in accordance with the present invention, a direct-current AGC source 44 is connected directly to the emitter 12 of transistor amplifier 8.

It is assumed, for the purpose of explaining this feature of the invention, that when the signal strength increases above a certain level, a current will be supplied by the AGC source 44 and for increasing signal strength, the AGC current will increase. Any increase in the AGC current, if applied to the emitter 12 of transistor 8 will cause the emitter current of transistor 8 to decrease by an amount substantially equal to the amount the AGC current is increased. As shown by curve 46 in the graph of FIGURE 2, wherein emitter current has been plotted against the gain of a typical transistor amplifier, such as the transistor amplifier 8, a decrease in emitter current will cause a decrease in the gain of the transistor, which has the effect of maintaining the amplitude level of the output signal substantially constant. The level at which the output signal tends to remain constant will be dependent on the emitter current of the transistor 8 for static operating conditions (i.e., in the absence of an alternating current signal), on the particular characteristics of the AGC current source and on the gain in the feedback circuit coupling the AGC source with transistor 8. In addition to supplying the desired effective AGC action, emitter current control in accordance with the invention will also tend to stabilize the circuit for temperature variations as will hereinafter be explained.

In FIGURE 3, reference to which is now made, a transistor 48, which may be the second detector of a superheterodyne signal receiver comprises a semi-conductive body 50 having three contacting electrodes which are designated as an emitter 52, a collector 54 and a base 56. The transistor 48 is illustrated as being, by way of example only, of the P-N-P type.

The transistor 48 has essentially zero bias applied between its base 56 and emitter 54 and operates to separate the modulation component from the received signal. Non-linearity of the transistor 8 characteristic curve is most pronounced at low signal levels and high percentages of modulation. Proper biasing potentials are provided by a battery 58, the positive terminal of which is grounded and the negative terminal of which is connected through a load resistor 59 to the collector 54 of the transistor detector 48.

Output signals from the transistor detector 48, such as audio frequency signals, may be taken from any convenient point in the circuit such as from a pair of output terminals 60, one of which is grounded, and the other of which is connected to the junction of collector 54 and the load resistor 59. A capacitor 62 by-passes unwanted radio-frequency signals to ground.

The input circuit for transistor detector 48 comprises an input transformer 68 having a primary winding 66, the opposite ends of which are respectively connected to input terminals 69, and a secondary winding 67 one end of which is connected with the base 56. In accordance with another feature of the present invention, the other end of secondary winding 67 is connected through a resistor 70 to the emitter 52 of transistor 48. Further in accordance with the invention, an audio frequency by-pass capacitor 72 is connected from the junction of secondary winding 67 and resistor 70 to a source of fixed reference potential or ground for the system, and a radio-frequency by-pass capacitor 74 is connected from the junction of emitter 52 and resistor 70 to ground. As will be hereinafter explained, the network comprising resistor 70 and by-pass capacitors 72 and 74 have been found to reduce distortion due to non-linearity in the detector characteristic while at the same time maintaining a sufficiently high conversion gain.

An AGC output lead 63 is connected through a filter for unwanted alternating current signals comprising a series resistor 64 and a grounded by-pass capacitor 65 to the emitter 52 of transistor 48.

In operation, the network comprising the resistor 70 and by-pass capacitors 72 and 74 provides degeneration at the audio frequencies, thereby reducing the distortion due to the non-linearity in the detection characteristic, but is not degenerative to direct currents so as not to adversely affect the AGC operation of the detector circuit. If it is assumed that an unmodulated intermediate frequency signal is applied to input terminals 69 and coupled through transformer 68 between the emitter 52 and the base 56 of transistor 48, rectified pulses will appear in the emitter 52 and the collector 54 of the transistor 48 having a repetition rate equal to the frequency of the applied signal. As was explained hereinbefore, capacitors 62 and 74 are so chosen as to present a low impedance path to radio-frequency signals, thus by-passing these signals to ground. Thus, there will be no potential drop due to the alternating current signal between the emitter 52 and the collector 54 during the zero modulation condition. A direct current will flow, however, from the emitter 52 through the semi-conductive body 50, the collector 54 and resistor 59 to the negative terminal of battery 58. The amplitude of this direct current will be equal to the average value of the rectified pulses in the emitter-collector circuit of transistor 48 and will be proportional to the amplitude of the applied input signal. Thus, as the intermediate frequency signal that is applied to terminals 69 increases, the direct current flowing in the emitter-collector circuit of the transistor 48 will also increase. Accordingly, a direct current proportional to the signal strength is available as a source of AGC current. This current may be applied from output lead 63 to one or more stages of the receiver whose gain is to be controlled. Substantially no direct current will flow through resistor 70, and consequently there will be no change in detection efficiency when a signal is applied to terminals 69.

Accordingly, when an unmodulated intermediate frequency signal is applied to the input terminals 69 of the transistor detector circuit there will be essentially no change in the base to emitter bias of transistor 48. When a modulated intermediate frequency signal is applied to the circuit, however, an audio frequency signal will appear on the emitter 52 of transistor 48, the amplitude of which, if resistor 70 is chosen to have a small resistance relative to the resistance of filter resistor 64, will be dependent on resistor 70 and the envelope of the current pulses in the emitter circuit.

As was explained hereinbefore, by-pass capacitor 72 presents a low impedance path to ground for audio frequency signals. The voltage developed across the resistor 70 due to the audio frequency signals will therefore be applied between the emitter 52 and the base 56 of transistor detector 48. This voltage will be in phase with the modulation envelope of the incoming modulated intermediate frequency signal. Accordingly, the voltage of the emitter 52 will be degenerative to audio frequency signals which has been found to considerably reduce and substantially eliminate distortion. Thus, in accordance with the invention, a sufficiently large AGC current is provided by a transistor detector which will also provide a substantially distortion-free output signal. In addition, the gain of the detector is maintained at a sufficiently high value so that the amplitude of the output signal is maintained at a level which is sufficiently high.

In FIGURE 4, the principles of the present invention are utilized to provide a substantially distortion-free transistor detector, which utilizes an N-P-N junction transistor 78, comprising a semi-conductive body 80 and three contacting electrodes which are designated as an emitter 82, a collector 84 and a base 86.

As in FIGURE 3, the transistor 78 has essentially zero bias applied between its base 86 and emitter 82 and operates to separate the modulation component from the received signal.

To provide operating potentials, the battery 58 has its positive terminal grounded and its negative terminal connected through a resistor 61 to the emitter 82 of transistor 78. Output signals may be taken from a pair of output terminals 60, one of which is grounded and the other of which is connected to the junction of collector 84 and radio frequency by-pass capacitor 62.

The input circuit for the N-P-N junction transistor 78 is identical with the input circuit for transistor 48 of FIGURE 3. Thus, the network comprising resistor 70 and by-pass capacitors 72 and 74 operates in the same manner as the same network of FIGURE 3 and is operative to reduce and substantially eliminate signal distortion.

As is well known and understood, junction transistors of the P-N-P type and the N-P-N type are referred to as opposite conductivity types. Thus, in the case of an N-P-N transistor, current will flow into the collector and out of the emitter, making the current flow opposite to that of a P-N-P junction transistor. Accordingly, if a N-P-N junction transistor detector is utilized for AGC control of one or more P-N-P transistor amplifiers, the AGC output lead 63 must be connected with the collector 84 to maintain the proper polarity for effective AGC action. Similarly, by reversing the polarity of the biasing source, a P-N-P junction transistor could be used for AGC control of one or more N-P-N transistor amplifiers.

Hence, as shown in FIGURE 4, the lead 63 is connected through filtering means comprising by-pass capacitor 65 and resistor 64 to the collector 84 of transistor detector 78, which has been illustrated as being an N-P-N junction transistor.

In operation, the circuit illustrated in FIGURE 4 is identical with the operation of the circuit shown in FIGURE 3. Thus, an increase in the applied signal will cause a corresponding increase in the direct current flowing in the collector-emitter circuit of transistor 78. This direct current is used as an AGC current source. In addition, by provision of the network comprising resistor 70 and by-pass capacitors 72 and 74, the output signal will be substantially free of distortion, as was previously explained.

Figure 5:
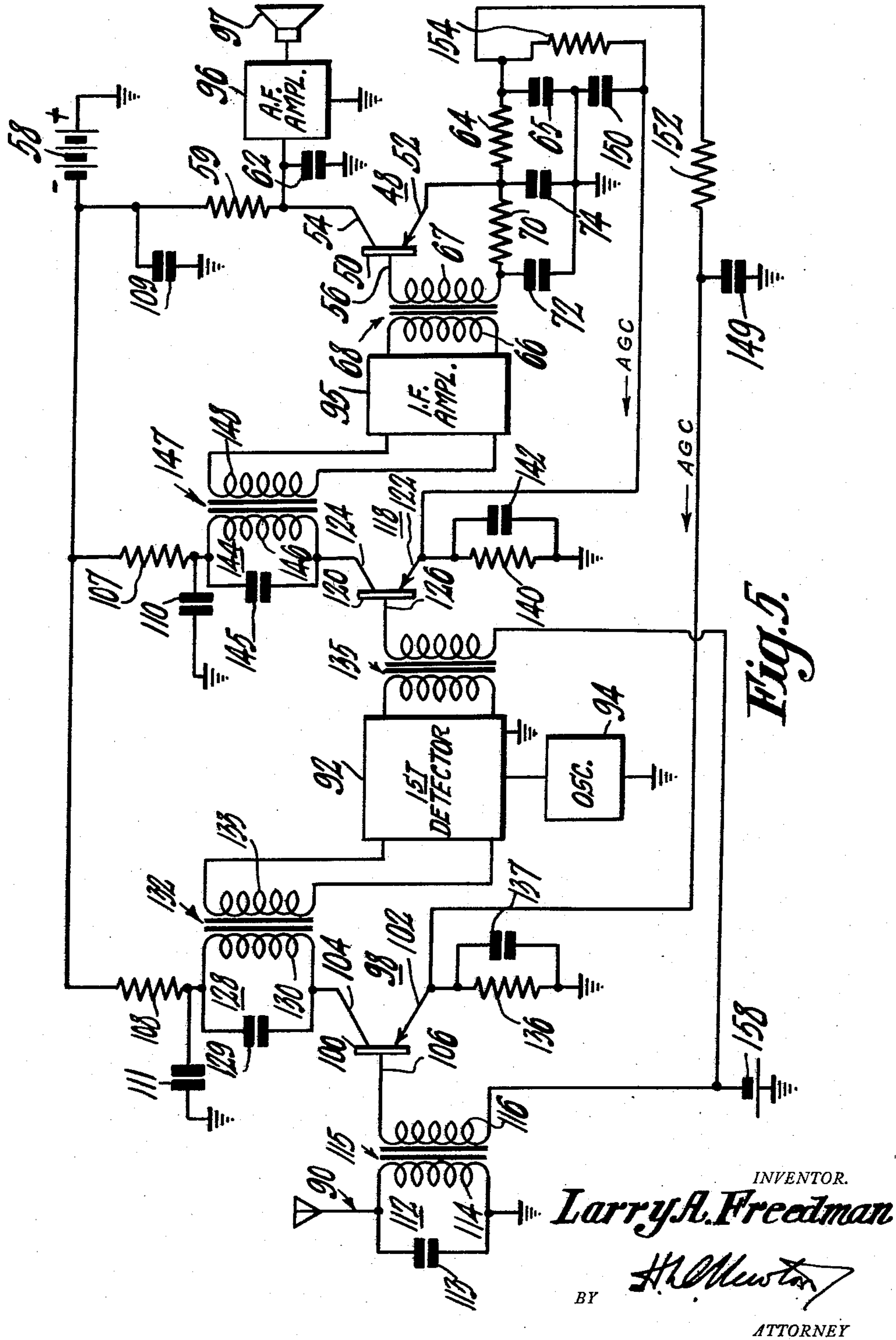
FIGURE 5 is a schematic circuit diagram of a transistor signal receiver showing the relation of an AGC system embodying the present invention to the various signal translating portions thereof.

In FIGURE 5, controlled stages of the type illustrated in FIGURE 1, such as transistor amplifiers 98 and 118, are used in conjunction with a transistor detector 48 of the type illustrated in FIGURE 3 to provide an improved AGC system for a radio signal receiver. The signal receiver comprises, in general, an antenna 90 of any suitable type, the radio frequency signal transistor amplifier 98, a first detector 92, a local oscillator 94, a first intermediate frequency signal transistor amplifier 118, a second intermediate frequency signal amplifier 95, the transistor signal detector 48, an audio frequency amplifier 96 and a loudspeaker 97 or other suitable sound reproducing or utilization means.

The frequency selective means for antenna 90 comprises a parallel resonant circuit 112 comprising a capacitor 113 and the primary winding 114 of a coupling transformer 115. One end of the secondary winding 116 of coupling transformer 115 is connected with the base 106 of radio frequency transistor amplifier 98 to couple incoming signals therewith, and the other end is connected to the battery 158 which provides constant base bias to transistor 98. The emitter 102 of transistor 98 is grounded through a resistor 136 which provides constant current emitter bias and thus temperature stability. The resistor 136 is by-passed for radio frequency signals by a parallel capacitor 137.

The output circuit for transistor 98 includes a frequency selective or parallel resonant tuned circuit 128 which is connected with the collector 104 of transistor 98 and includes a capacitor 129 and an inductor 130, which is the primary winding of an interstage coupling transformer 132. The low signal voltage end of the tuned circuit 128 is connected through a decoupling resistor 108 to the negative terminal of the biasing battery 58. A by-pass capacitor 111 is connected from the junction of tuned circuit 128 and the resistor 108 to ground. The secondary winding 133 of transformer 132 is connected to the receiver first detector 92, which may be of any suitable type. The local oscillator 94 is also connected with the detector 92.

The beat or intermediate frequency signal produced by the heterodyning of a local oscillator signal with an input signal in the first detector 92 is coupled through a further interstage coupling transformer 135 to the base 126 of the first intermediate frequency transistor amplifier 118 which includes semi-conductive body 120 and the emitter 122 of which is connected to ground through a resistor 140 which provides constant current emitter bias. The resistor 140 is shunted by a by-pass capacitor 142. Constant base bias is obtained by connecting the base 126 through the secondary winding of the transformer 135 to the negative terminal of the biasing battery 158.

The output circuit for the transistor 118 includes an intermediate frequency selective or parallel resonant tuned circuit 144, the high signal voltage end of which is connected to the collector 124 of the tranistor 118. The low signal voltage end of the tuned circuit 144 is connected through a decoupling resistor 107 to the negative terminal of the biasing battery 58. A by-pass capacitor 110 is connected from the junction of the tuned circuit 144 and the resistor 107 to ground. The parallel resonant circuit 144 comprises a capacitor 145 and an inductor 146, which is the primary winding of another interstage coupling transformer 147, the secondary winding 148 of which is connected to a second intermediate frequency amplifier 95 which may be of the same type as transistor amplifier 118 or any other suitable type. Amplified intermediate frequency signals are coupled by means of coupling transformer 68 between the base and emitter of the transistor second detector 48, which is identical with the detector illustrated in FIGURE 3 of the drawing. The detected audio frequency signals are coupled from the output or collector electrode 54 of detector 48 to an audio frequency amplifier 96 of any suitable well known type, the output of which is connected to suitable utilization means such as loudspeaker 97. As thus described, the receiver illustrated in FIGURE 5 is seen to be of the well known superheterodyne type.

AGC control, in accordance with the AGC system embodying the present invention, is applied to two stages of the signal receiver. Accordingly, the AGC output circuit for the second detector 48 includes filtering means comprising the resistor 64, by-pass capacitors 65, 149 and 150, and a pair of isolating resistors 152 and 154, the resistor 152 being connected, in accordance with the invention, to the emitter 102 of radio frequency transistor amplifier 98 and the resistor 154 being connected to the emiter 122 of the first transistor intermediate frequency amplifier 118. Thus, as was explained hereinbefore, an increasing signal will increase the direct current flowing in the emitter-collector circuit of transistor detector 48. The emitter-collector current of transistor detector 48 is used as the AGC current source. Accordingly, as this current increases, the emitter current of the two controlled stages, (transistors 98 and 118), will decrease, and as was seen from the graph of FIGURE 2, will cause corresponding decreases in the gain of these two stages to obtain AGC action. By virtue of the particular circuitry associated with the detector, as was explained in connection with FIGURE 1, an effective AGC control is obtained and the output signal will be substantially disortion-free.

In addition to the above advantages, an AGC system in accordance with the present invention is characterized by stable operation with ambient temperature variations. If, for example, the ambient temperature increases, the total current through transistor detector 48 will also increase. The emitter current through transistor amplifiers 98 and 118 will also tend to increase as the temperature increases even though constant current emitter bias is used and the increase of emitter current of these transistors will tend to be cancelled by the increased current through the detector 48. Thus, the transistor emitter currents of transistors 98 and 118 will tend to remain constant with temperature variations resulting in relatively stable operation.

Accordingly, by controlling the emitter current of the controlled stages for AGC action, stable operation as well as effective and reliable AGC control is realized.

An AGC system in accordance with the present invention has the further advantage that the transistors used for the various stages of the receiver are readily interchanged and replaced. Thus, an N-P-N junction transistor detector may be used to control two other N-P-N junction transistor amplifiers merely be reversing the polarity of the biasing source. Further, an N-P-N junction transistor detector of the type shown in FIGURE 4 may be used to control one or more P-N-P junction transistor amplifiers, the polarity of the biasing source remaining as shown in FIGURE 5. Since the values of the circuit components are not critical, transistors having characteristics which vary one from another over relatively large limits may be utilized.

While it should be understood that the circuit specifications may vary according to the design for any particular application, the following circuit specifications are included for the circuit of FIGURE 5 by way of example only:

| | |
|---|---|
| Resistors **64**, **70**, **152**, **154**, **140** and **136** | 330, 91, 680, 680, 1000 and 1000 ohms, respectively. |
| Capacitors **65**, **74**, **72**, **142** and **137** | 0.1, 0.5, 50, 0.1 and 0.1 microfarads, respectively. |
| Battery **58** | 6 volts. |

As described herein, an AGC system for radio signal receivers employing semi-conductor devices or transistors in the signal translating and amplifying portions thereof, includes an AGC current source characterized by sufficient gain and a substantially distortion-free signal output. By utilizing this source to control one or more signal amplifying stages as described herein, stable operation and effective AGC action is realized. Accordingly, the AGC system is characterized by efficient, reliable and high quality performance at a relatively low construction cost.

What is claimed is:

1. In a radio receiver the combination comprising, a source of automatic gain control current including alternating current signal detection means, said means comprising a semiconductor device including a base, an emitter and a collector electrode, energization means connected with said electrodes, conductive circuit means coupled with said emitter electrode for deriving from said device an automatic gain control current which increases with increases in amplitude of an applied alternating current signal, a semi-conductor signal amplifying device including a base, an emitter and a collector electrode, and circuit means including a direct current connection between the emitter electrode of said signal detection means and the emitter electrode of said signal amplifying device for directly applying said automatic gain control current to the emitter electrode of said signal amplifying device to reduce the emitter current thereof by an amount substantially equal to the increase in said gain control current as the amplitude of said alternating current signal increases.

2. In an automatic gain control system for radio receivers and the like the combination comprising, semiconductor signal detection means including a semi-conductor body having an emitter, a collector and a base electrode cooperatively associated therewith, energization means connected with said electrodes, conductive signal input means including a coupling element connected with said base electrode for applying an alternating current signal thereto, an impedance element connected between said emitter electrode and said coupling element, means providing a low impedance path for alternating current signals connected in parallel with said impedance element, a semi-conductor signal amplifying device having a semi-conductive body and an emitter, a collector and a base electrode cooperatively associated therewith, and circuit means including a direct current connection between an electrode of said signal detection means and the emitter electrode of said signal amplifying device for applying an automatic gain control current to the emitter electrode of said signal amplifying device to reduce the emitter current thereof by an amount substantially equal to the increase in said gain control current as the amplitude of said alternating current signal increases.

3. An automatic gain control system for radio receivers and the like comprising in combination, signal detection means providing a direct automatic gain control current which varies in accordance with variations in the amplitude of the alternating current signal which is applied thereto, a signal amplifying transistor having base, emitter, and collector electrodes, signal input means connected for applying an input signal between said base and emitter electrodes, signal output means connected for deriving an output signal from said collector electrode, means for maintaining the voltage at said base electrode relatively fixed, and direct-current conductive means connecting said detection means with the emitter electrode of said transistor to directly apply said gain control current to said emitter elecrode for directly reducing the emitter current of said transistor by an amount substantially equal to the increase in said gain control current as the amplitude of said alternating current signal increases.

4. An automatic gain control system for radio receivers and the like comprising in combination, signal detection means providing a direct automatic gain control current which varies in accordance with variations in the amplitude of the alternating current signal which is applied thereto, a signal amplifying transistor having base, emitter, and collector electrodes, signal input means connected for applying an input signal between said base and emitter electrodes, signal output means connected for deriving an output signal from said collector electrode, means for maintaining the voltage at said base electrode relatively fixed, means including a degenerative stabilizing resistor connecting said emitter electrode with a point of reference potential in said system, and direct-current conductive means connecting said detection means with the junction of said resistor and the emitter electrode of said transistor to directly apply said gain control current to said emitter electrode for directly reducing the emitter current of said transistor by an amount substantially equal to the increase in said gain control current as the amplitude of said alternating current signal increases.

5. A signal detector and automatic gain control source for signal receiving systems comprising, in combination, a transistor including base, emitter, and collector electrodes, means for applying a signal between said base and emitter electrodes including a transformer having primary and secondary windings, said secondary winding having a pair of terminals, means connecting one of said terminals with said base electrode, means including a first resistor connecting said other terminal with said emitter electrode, means including a filter network including a second resistor connected for deriving an automatic gain control signal from one of said collector and emitter electrodes, the resistance of said first resistor being small relative to the resistance of said second resistor to provide degeneration of said applied signal without degeneration of direct-current, and means for deriving a detected signal from between said collector and emitter electrodes.

6. In a radio signal receiver including a plurality of signal amplifying stages, the combination comprising, a second detector and automatic gain control source stage including a transistor having base, emitter, and collector electrodes, said transistor being connected in said receiver as a common emitter amplifier, means for applying an intermediate frequency signal from one of said amplifying stages to said transistor including a transformer having a primary winding coupled with said one of said amplifying stages and a secondary winding including a pair of terminals, means connecting one of said terminals with said base electrode for applying said intermediate frequency signal thereto, a first resistor connected from said other terminal to said base electrode, means for deriving an automatic gain control signal from one of said emitter and collector electrodes, means including a filter network including a second resistor for applying said gain control signal to one of said amplifying stages to control the gain thereof inversely with increases in the amplitude of said intermediate frequency signal, said first resistor having a small resistance relative to the resistance of said second resistor to provide degeneration of audio frequency signals without degeneration of direct-current, and means for deriving an audio frequency signal from said collector electrode.

7. In an automatic gain control system for radio receivers and the like the combination comprising, a semi-conductor signal detection means including a semi-conductor device including an emitter, a collector and a base electrode, energization means including a source of potential for biasing said electrodes, means providing a signal output circuit for said signal detection means, means for applying an input signal between said base and emitter electrodes including a transformer having primary and secondary windings, said secondary winding having a pair of terminals, means connecting one of said terminals with said base electrode, means including a first resistor connecting said other terminal with said emitter electrode, means including a filter network including a second resistor connected for deriving an automatic gain potential from one of said collector and emitter electrodes, the resistance of said first resistor being small relative to the resistance of said second resistor, and means including a first by-pass capacitor connected between one end of said first resistor and a point of fixed reference potential and a second by-pass capacitor connected between the other end of said first resistor and said point of fixed reference potential, said last named means providing a low impedance path for alternating current signals.

8. In an automatic gain control system for radio receivers and the like, a source of automatic gain control current comprising in combination, semi-conductor signal detection means including a semi-conductive body having an emitter, a collector and a base electrode in contact therewith, energization means including a source of potential for biasing said electrodes, conductive signal input means including an inductor having a pair of terminals, means connecting one of said terminals with said base electrode for applying an alternating current signal thereto, a first resistor connected between said emitter electrode and the other terminal of said inductor, signal output means connected with said collector electrode for deriving an alternating current output signal therefrom, said emitter electrode being common to said signal input and said signal output means, conductive filter means including a second resistor coupled with one of said electrodes for deriving an automatic gain control current therefrom, the resistance of said first resistor being small relative to the resistance of said second resistor to provide degeneration of said applied signal without degeneration of direct-current, and means providing a low impedance path for alternating current signals connected in parallel with said first resistor and to a point of fixed reference potential.

9. In a radio frequency signal receiver the combination comprising, a source of direct current automatic gain control potential including alternating current signal detection means, said means comprising a semi-conductor device having a semi-conductive body and a base, an emitter and a collector electrode cooperatively associated therewith, energization means including a source of potential for biasing the electrodes of said device, means for deriving an output signal from said collector electrode, means for applying an input signal to said base electrode, a stabilizing resistor of relatively low resistance direct-current conductively connected between said base and emitter electrodes, and means comprising a filter network having resistance connected with said emitter electrode for deriving an automatic gain control signal therefrom, the resistance of said stabilizing resistor being small relative to the resistance of said filter network.

10. An automatic-gain-control system for a signal-translating apparatus comprising: a transistor including an emitter and a base and having a nonlinear emitter current-curent gain factor characteristic; a stage including said transistor for translating an applied wave signal; a detector coupled to said stage and maintained in a predetermined conductivity state in the absence of said translated signal but responsive to variations in a characteristic thereof which modify the conductivity of said detector; and a pair of current-conducting paths including a substantially constant-current source common thereto, one of said paths being connected to said emitter in biasing relation to said emitter and base to provide approximately a peak value of current gain factor when the emitter current is representative of a predetermined amplitude of said applied signal and the other of said paths being connected to said detector and responsive to said conductivity thereof for modifying the current division in said paths and thus modifying said current gain factor characteristic in a sense to maintain said characteristic of said translated signal within a relatively narrow range for a wide range of applied wave-signal intensities.

11. An automatic-gain-control system for a signal-translating apparatus comprising: a transistor including an emitter and a base and having a nonlinear emitter current-current gain factor characteristic; a stage including said transistor for translating an applied wave signal; a detector coupled to said stage and maintained in a predetermined conductivity state in the absence of said translated signal but responsive to variations in the average amplitude thereof which modify the conductivity of said detector; and a pair of current-conducting paths including a substantially constant-current source common thereto, one of said paths being connected to said emitter in biasing relation to said emitter and base to provide approximately a peak value of current gain factor when the emitter current is representative of the lowest usable amplitude of said applied signal and the other of said paths being connected to said detector and responsive to said conductivity thereof for modifying the current division in said paths and thus modifying said current gain factor characteristic in a sense to maintain said average amplitude of said translated signal within a relatively narrow range for a wide range of applied wave-signal intensities.

12. An automatic-gain-control system for a radio receiver comprising: a junction transistor including an emitter and a base and having a nonlinear emitter current-current gain factor characteristic; a stage including said transistor for translating a received modulated wave signal; a detector coupled to said stage and maintained in a predetermined conductivity state in the absence of said translated signal but responsive to variations in the average amplitude thereof which modify the conductivity of said detector; and a pair of current-conducting paths including a substantially constant-current source common thereto, one of said paths being connected to said emitter in biasing relation to said emitter and base to provide approximately a peak value of current gain factor when the emitter current is representative of the lowest usable amplitude of said applied signal and the other of said paths being connected to said detector and responsive to said conductivity thereof for modifying the current division in said paths and thus modifying said current gain factor characteristic in a sense to maintain said average amplitude of said translated signal within a relatively narrow range for a wide range of applied wave-signal intensities.

13. An automatic-gain-control system for a signal-translating apparatus comprising: a transistor including an emitter and a base and having a nonlinear emitter current-current gain factor characteristic; a stage including said transistor for translating an applied wave signal; a detector coupled to said stage and maintained in a predetermined conductivity state in the absence of said translated signal but responsive to variations in the average amplitude thereof which modify the conductivity of said detector; and a pair of current-conducting paths including a substantially constant-current source with a resistive impedance common to said paths, one thereof being connected to said emitter in biasing relation to said emitter and base to provide approximately a peak value of current gain factor when the emitter current is representative of the lowest usable amplitude of said applied signal and the other of said paths being connected to said detector and responsive to said conductivity thereof for modifying the current division in said paths and thus modifying said current gain factor characteristic in a sense to maintain said average amplitude of said translated signal within a relatively narrow range for a wide range of applied wave-signal intensities.

14. A automatic-gain-control system for a signal-translating apparatus comprising: a transistor including an emitter and a base and having a nonlinear emitter current-current gain factor characteristic; a stage including said transistor for translating an applied wave signal; a detector coupled to said stage and maintained in a predetermined conductivity state in the absence of said translated signal but responsive to variations in the average amplitude thereof which modify the conductivity of said detector; and a pair of current-conducting paths including a substantially constant-current source with a resistive impedance common to said paths and having a resistance from ten to twenty times greater than the internal emitter-base impedance of said transistor, one of said paths being connected to said emitter in biasing relation to said emitter and base to provide approximately a peak value of current gain factor when the emitter current is representative of the lowest usable amplitude of said applied signal and the other of said paths being connected to said detector and responsive to said conductivity thereof for modifying the current division in said paths and thus modifying said current gain factor characteristic in a sense to maintain said average amplitude of said translated signal within a relatively narrow range for a wide range of applied wave-signal intensities.

15. An automatic-gain-control system for a signal-translating apparatus comprising: a transistor including an emitter and a base and having a nonlinear emitter current-current gain factor characteristic; a stage including said transistor for translating an applied wave signal; a detector coupled to said stage and maintained in a predetermined conductivity state in the absence of said translated signal but responsive to variations in the average amplitude thereof which modify the conductivity of said detector; and a pair of current-conducting paths including a substantially constant-current source common thereto, one of said paths being connected to said emitter in biasing relation to said emitter and base to provide approximately a peak value of current gain factor when the emitter current is representative of the lowest usable amplitude of said applied signal, said current gain factor remaining substantially constant when the amplitude of said applied wave signal increases over a small range above said lowest usable amplitude and then decreasing abruptly when said amplitude increases above said small range, and the other of said paths being connected to said detector and responsive to said conductivity thereof for modifying the current division in said paths and thus modifying said current gain factor characteristic in a sense to maintain said average amplitude of said translated signal within a relatively narrow range for a wide range of applied wave-signal intensities.

16. An automatic-gain-control system for a radio receiver comprising: a transistor including an emitter and a base and having a nonlinear emitter current-current gain factor characteristic; a stage including said transistor for translating a received modulated wave signal; a detector coupled to said stage for deriving the modulation components of said translated signal and biased substantially of cutoff in the absence of said translated signal but responsive to variations in the average amplitude thereof which modify the conductivity of said detector; and a pair of current-conducting paths including a substantially constant-current source common thereto, one of said paths being connected to said emitter in biasing relation to said emitter and base to provide approximately a peak value of current gain factor when the emitter current is representative of the lowest usuable amplitude of said applied signal and the other of said paths being connected to said detector and responsive to said conductivity thereof for modifying the current division in said paths and thus modifying said current gain factor characteristic in a sense to maintain said average amplitude of said translater signal within a relatively narrow range for a wide range of applied wave-signal intensities.

17. An automatic-gain-control system for a signal-translating apparatus comprising: a first transistor including an emitter and a base and having a nonlinear emitter current-current gain factor characteristic; a stage including said transistor for translating an applied wave signal; a detector, including a second transistor having an emitter-base input circuit operating without bias and coupled to said stage, responsive to variations in the average amplitude of said translated signal which modify the conductivity of said detector; and a pair of current-conducting paths including a substantially constant-current source common thereto, one of said paths being connected to said emitter in biasing relation to said emitter and base of said first transistor to provide approximately a peak value of current gain factor when the emitter current thereof is representative of the lowest usable amplitude of said applied signal and the other of said paths being connected to said input circuit of said detector and responsive to said conductivity thereof for modifying the current division in said paths and thus modifying said current gain factor characteristic in a sense to maintain said average amplitude of said translated signal within a relatively narrow range for a wide range of applied wave-signal intensities.

References Cited in the file of this patent

UNITED STATES PATENTS

| | | |
|---|---|---|
| 2,001,825 | Nelson | May 21, 1935 |
| 2,012,421 | Dickey | Aug. 27, 1935 |
| 2,031,238 | Thompson | Feb. 18, 1936 |
| 2,144,921 | Hunt | Jan. 24, 1939 |
| 2,233,782 | Kimball | Mar. 4, 1941 |
| 2,538,772 | Ferrill | Jan. 23, 1951 |
| 2,647,957 | Mallinckrodt | Aug. 4, 1953 |

OTHER REFERENCES

Article (4), "The Transistor," by Bell Laboratories, pp. 174–175, published December 4, 1951.

Article: "Transistor Circuit Design"; by Raisbeck; pages 128–132 and 134 of Electronics, December 1951.

Article: "Junction Transistor Circuit Applications"; by Sulzer, pages 170–173 of Electronics, August 1953.

Article: FIG. 19 and pages 157–158 from "The Transistor," by Bell Laboratories, published December 4, 1951.

Publication (5): "The Transistor," by Bell Laboratories, pp. 401–402 and 409.